(12) United States Patent
Choi

(10) Patent No.: US 8,679,706 B2
(45) Date of Patent: Mar. 25, 2014

(54) PHOTOMASK PROCESSING TECHNIQUES

(75) Inventor: Chang Ju Choi, Fremont, CA (US)

(73) Assignee: Intel corporation, Santa Clara, CA (US)

( * ) Notice: Subject to any disclaimer, the term of this patent is extended or adjusted under 35 U.S.C. 154(b) by 49 days.

(21) Appl. No.: 13/561,410

(22) Filed: Jul. 30, 2012

(65) Prior Publication Data

US 2014/0030638 A1    Jan. 30, 2014

(51) Int. Cl.
*G03F 1/26* (2012.01)
*G03F 1/50* (2012.01)

(52) U.S. Cl.
USPC .......................................................... 430/5

(58) Field of Classification Search
USPC ........................ 430/5, 30, 322, 323
See application file for complete search history.

(56) References Cited

U.S. PATENT DOCUMENTS

2010/0075236 A1*   3/2010   Hashimoto et al. .............. 430/5

* cited by examiner

*Primary Examiner* — Stephen Rosasco
(74) *Attorney, Agent, or Firm* — Finch & Maloney PLLC

(57) ABSTRACT

Techniques are disclosed for enhancing critical dimension (CD) resolution in photomask processing. In some cases, the techniques can be implemented, for instance, to enhance space and line pattern resolution independently on a given phase-shifting photomask (PSM). The disclosed techniques can be implemented, for example, to extend existing photolithography techniques/technologies (e.g., 193 nm photolithography) to additional process nodes. For instance, some embodiments can be used to produce extremely high-resolution photomasks which generate features having sizes in the 10 nm node and beyond. The disclosed techniques can be implemented in the fabrication of a wide range of integrated circuits (ICs) and other devices.

26 Claims, 4 Drawing Sheets

PHOTOMASK PROCESSING TECHNIQUES

BACKGROUND

Photomasks can be used in a variety of lithographic processes for the manufacture of integrated circuits (ICs) and other microelectronic components. However, there are a number of non-trivial challenges associated with photomask design, and continued process scaling will tend to exacerbate such problems.

For purposes of clarity, not every component may be labeled in every drawing. Furthermore, as will be appreciated in light of this disclosure, the figures are not necessarily drawn to scale or intended to limit the claimed invention to the specific configurations shown. For instance, while some figures generally indicate straight lines, right angles, and smooth surfaces, an actual implementation of the disclosed techniques may produce less than perfect straight lines, right angles, and some features may have surface topology or otherwise be non-smooth, given real world limitations of processing equipment and materials. In short, the figures are provided merely to show example structures.

DETAILED DESCRIPTION

Techniques are disclosed for enhancing critical dimension (CD) resolution in photomask processing. In some cases, the techniques can be implemented, for instance, to enhance space and line pattern resolution independently on a given phase-shifting photomask (PSM). The disclosed techniques can be implemented, for example, to extend existing photolithography techniques/technologies (e.g., 193 nm photolithography) to additional process nodes. For instance, some embodiments can be used to produce extremely high-resolution photomasks which generate features having sizes in the 10 nm node and beyond. The disclosed techniques can be implemented in the fabrication of a wide range of integrated circuits (ICs) and other devices. Numerous configurations and variations will be apparent in light of this disclosure.

General Overview

As previously noted, photomask processing involves a number of non-trivial challenges. For example, in photomask processing it is very difficult to improve one type of resolution without degrading another type. That is, with existing techniques, there is an inherent resolution trade-off—improvements in space resolution detract from line resolution and vice versa. For instance, a photomask plate which has undergone low-bias process patterning using existing techniques typically will have a high space resolution (i.e., small space size), but will suffer from poor line resolution. Conversely, a photomask plate which has undergone high-bias process patterning using existing techniques typically will have a high line resolution (i.e., small line size), but will suffer from poor space resolution. Otherwise stated, existing photolithography techniques/approaches do not have the capability to control both space pattern resolution and line pattern resolution independently. Thus, typical attempts at optimizing process bias generally involve making adjustments in either lithography or etching and with respect to one pattern type only—either space patterns or line patterns.

Also, existing photolithography techniques/technologies (e.g., 193 nm photolithography systems) are generally incapable of achieving a combined pattern resolution (i.e., minimum space feature size plus minimum line feature size) lower than 105 nm, which precludes existing photomask architectures from achieving very small space features as well as very small line features on the same photomask plate. For instance, a photomask plate having a 14 nm photomask requirement may require, for example, the ability to resolve a 38 nm line pattern and a 60 nm space pattern on the same photomask plate—a combined pattern resolution requirement of 98 nm, which is below existing capabilities. As will be appreciated, next-generation photomasks are poised to have even more challenging resolution requirements (e.g., 10 nm and beyond)

requiring even more aggressive combined pattern resolution capabilities (e.g., less than or equal to about 80 nm.

Thus, and in accordance with an embodiment of the present invention, techniques are disclosed for enhancing critical dimension (CD) resolution in photomask processing. In accordance with an embodiment, the techniques disclosed herein can be implemented in a given phase-shift photomask process flow (e.g., to optimize or otherwise improve the lithography and/or etch processes thereof) to substantially enhance CD resolution on space features and line features independently on a single photomask.

In accordance with an embodiment, the disclosed photomask processing techniques can be utilized to control space pattern and line pattern independently without the typical CD resolution trade-off observed with existing photomask processing techniques/approaches. For instance, the disclosed etching techniques, in accordance with an embodiment, can be utilized to enhance line resolution. For example, the absorber layer and/or phase-shift layer of a phase-shift photomask can be trim etched to improve line (or pad) pattern resolution, in accordance with an embodiment. Furthermore, the disclosed spacer formation techniques, in accordance with an embodiment, can be utilized to enhance space resolution. For example, a spacer can be formed on at least a portion of a phase-shift photomask to improve space (or contact) pattern resolution, in accordance with an embodiment. As will be appreciated in light of this disclosure, and in accordance with an embodiment, CD resolution may be enhanced by utilizing an additional lithography step (e.g., defining of a photoresist pattern) which results in a double patterning process that produces better photomask pattern resolution as compared with existing single patterning processes.

In accordance with an embodiment, the disclosed techniques can be implemented with existing photomask architectures as well as with next-generation photomasks (e.g., requiring combined pattern resolution tighter than 14 nm). In some cases, and in accordance with an embodiment, the improvements in combined pattern resolution resultant from independent control over each individual pattern resolution may extend the utility of existing photolithography technologies (e.g., 193 nm photolithography) beyond their intrinsic lithography/etch resolution limits for use in more technology nodes (e.g., 14 nm node, 10 nm node, etc., and beyond). Some embodiments of the present invention may provide a form of mask-level multi-patterning which overcomes or otherwise reduces the resolution barrier posed by the fact that current resolution capabilities are already saturated with existing photomask process integration flows.

In accordance with an embodiment, the techniques disclosed herein can be implemented to produce extremely high-resolution photomasks that may be used, for instance, in the fabrication of integrated circuits (ICs) and other microelectronic devices. In some cases, such photomasks may have both extremely small space features and line features (e.g., in the 14 nm node, 10 nm node, etc., and beyond) which otherwise would not be obtainable with existing techniques/technologies. Other suitable uses for the techniques disclosed herein will depend on a given application and will be apparent in light of this disclosure.

As will be appreciated further in light of this disclosure, and in accordance with an embodiment, use of the techniques provided herein may be detected, for example, by visual or other inspection (e.g., microscope, etc.) of a given IC or other device that has undergone lithography using a phase-shift photomask and which has a combined pattern resolution less than 105 nm at the photomask level (4× scale), such as a combined pattern resolution of 100 nm or less, 95 nm or less, 90 nm or less, 85 nm or less, or 80 nm or less.

Photomask Blank Structure

Figure 1:
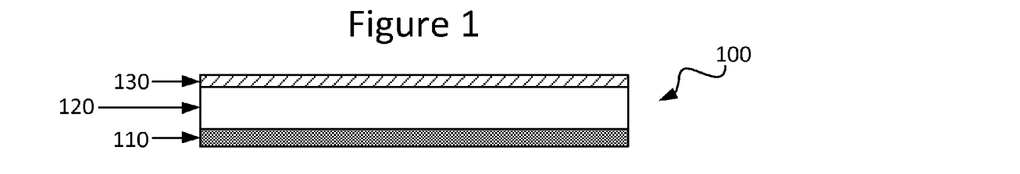
FIG. 1 illustrates a photomask blank configured in accordance with an embodiment of the present invention.

FIG. 1 illustrates a photomask blank 100 configured in accordance with an embodiment of the present invention. As can be seen, photomask blank 100 includes a substrate 110, a layer of phase-shifting material 120 deposited on substrate 110, and an absorber layer 130 deposited on phase-shift layer 120. As will be appreciated in light of this disclosure, photomask blank 100 may include additional, fewer, and/or different elements or components from those here described, and the claimed invention is not intended to be limited to any particular photomask blank configurations, but can be used with numerous configurations in numerous applications. For instance, in some cases, phase-shifting layer 120 and substrate 110 may be effectively combined (e.g., substrate 110 is of a greater thickness) as a single quantity of material and thereafter patterned with one or more regions of different thickness to achieve desired phase shifting effects, in accordance with an embodiment.

In accordance with an embodiment, substrate 110 can be any light-transmissive/transparent optical material suitable for implementation in a phase-shifting photomask, including, but not limited to: (1) quartz; (2) glass; (3) silicon (Si); and/or (4) any other suitably transmissive or partially transmissive material. The geometry and dimensions of substrate 110 may be customized for a given application. As previously noted, in some embodiments substrate 110 may be of a suitable thickness to be patterned with one or more phase-shifting features integral thereto (e.g., phase-shift layer 120, discussed below, may be omitted). Other suitable configurations and/or materials for substrate 110 will depend on a given application and will be apparent in light of this disclosure.

In accordance with an embodiment, phase-shift layer 120, when included, can be any phase-shifting material suitable for implementation in a phase-shifting photomask, such as, but not limited to molybdenum silicide compounds, including: (1) molybdenum disilicide ($MoSi_2$); (2) molybdenum silicide nitride ($MoSi_xN_y$); and/or (3) molybdenum silicide nitride oxide ($MoSi_xN_yO_z$). In some cases, and in accordance with an embodiment, phase-shift layer 120 may comprise the same material as substrate 110 and may be patterned to achieve the desired phase shifting effects. Phase-shift layer 120 may be of any thickness suitable for a given application. Furthermore, phase-shift layer 120 may be deposited or otherwise formed on substrate 110 using any suitable deposition techniques, such as physical vapor deposition (PVD) (e.g., sputtering). Other suitable configurations, materials, and/or deposition techniques for phase-shift layer 120 will depend on a given application and will be apparent in light of this disclosure.

In accordance with an embodiment, absorber layer 130 can be any absorber material suitable for implementation in a phase-shifting photomask, including, but not limited to: (1) chromium (Cr); (2) a tantalum (Ta)-containing material, such as tantalum nitride (TaN) or tantalum oxynitride (TaON); and/or (3) any other suitable non-transmissive or partially transmissive material having a desired degree of opacity. Absorber layer 130 can be configured to provide a given phase-shifting photomask with one or more non-transmissive/opaque regions. Also, absorber layer 130 may be of any thickness suitable for a given application. Furthermore, absorber layer 130 may be deposited or otherwise formed on phase-shift layer 120 (and/or on substrate 110) using any suitable deposition techniques, such as, but not limited to, PVD (e.g., sputtering). Other suitable configurations, materials, and/or deposition techniques for absorber layer 130 will depend on a given application and will be apparent in light of this disclosure.

Resolution Enhancement Process Flow #1

FIGS. 2A-2D illustrate a CD resolution enhancement process flow in accordance with an embodiment of the present invention. The process flow begins as in FIG. 2A, which is a cross-section view of a photomask plate 101 formed by low-bias process patterning of the photomask blank 100 of FIG. 1, in accordance with an embodiment of the present invention. As can be seen, the low-bias process patterning may provide a photomask plate 101 having high space resolution (i.e., small space size). After such patterning, absorber layer 130 and phase-shift layer 120 may be etched to form a pattern of phase-shift features on substrate 110. The low-bias process patterning can be performed using any suitable dry etch and/or plasma etch techniques, in accordance with an embodiment. After etching, photomask plate 101 may be cleaned, as desired.

Figure 2A:
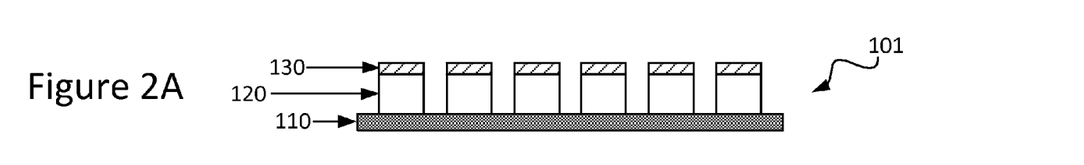
FIG. 2A is a cross-section view of a photomask plate formed by low-bias process patterning of the photomask blank of FIG. 1, in accordance with an embodiment of the present invention.
Figure 2B:
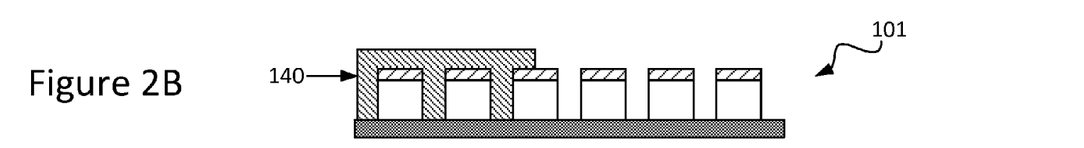
FIG. 2B is a cross-section view of the photomask plate of FIG. 2A after defining a photoresist pattern thereon, in accordance with an embodiment of the present invention.

Next, the process flow continues as in FIG. 2B, which is a cross-section view of the photomask plate 101 of FIG. 2A after defining a photoresist pattern 140 thereon, in accordance with an embodiment of the present invention. As can be seen, this additional lithography process may be performed, for example, to define the region/portion of photomask plate 101 that is to be populated by phase-shift features characterized by high line resolution. Photoresist pattern 140 can be any resist material (e.g., organic, inorganic, molecular, hybrid, etc.) suitable for patterning lithographic features. For instance, in some specific example embodiments, photoresist pattern 140 may be a polymer, such as, but not limited to: (1) poly(methyl methacrylate) (PMMA); (2) poly(dimethyl glutarimide) (PMGI); (3) phenol formaldehyde (PF) resin; (4) SU-8; and/or (5) any other suitable photoresist material. Photoresist pattern 140 may be of any desired dimensions, depending on the lithographic feature to be formed on substrate 110 (e.g., the dimensions of photoresist pattern 140 may be adjusted to alter the dimensions of one or more phase-shift features to be formed on/from substrate 110). Furthermore, photoresist pattern 140 may be defined or otherwise patterned using any of a wide range of suitable deposition/lithography techniques, such as, but not limited to: (1) coating processes; (2) electron beam (e-beam) lithography processes; and/or (3) developing processes. Other suitable configurations, techniques, and/or materials for photoresist 140 will depend on a given application and will be apparent in light of this disclosure.

Figure 2C:
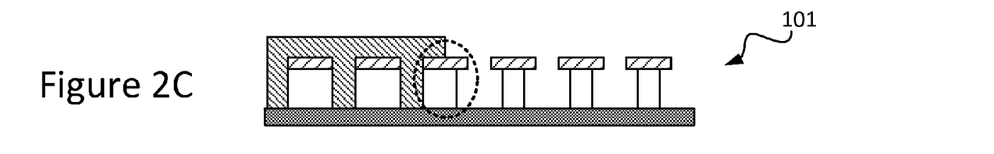
FIG. 2C is a cross-section view of the photomask plate of FIG. 2B after etching the phase-shift layer thereof, in accordance with an embodiment of the present invention.

Thereafter, the process flow continues as in FIG. 2C, which is a cross-section view of the photomask plate 101 of FIG. 2B after etching the phase-shift layer 120 thereof, in accordance with an embodiment of the present invention. Phase-shift layer 120 can be etched or otherwise trimmed, for example, by plasma etching. In some specific example instances in which phase-shift layer 120 comprises a molybdenum silicide compound (e.g., $MoSi_2$, $MoSi_xN_y$, $MoSi_xN_yO_z$, etc.), trim etching can be performed with isotropic plasma with fluorine (F)-based chemistry. In some such cases, a high inductively coupled plasma (ICP) source power (e.g., greater than or equal to about 100 W), high pressure (e.g., greater than or equal to about 3 mT), and low bias power (e.g., less than or equal to about 50 W) may be desired. Furthermore, in some instances, additional compounds such as sulfur hexafluoride ($SF_6$), nitrogen trifluoride ($NF_3$), and/or hydrofluorocarbons ($C_xF_yH_z$) may be used in the etching process in conjunction with buffer gases such as argon (Ar), helium (He), nitrogen ($N_2$), and/or CO, compounds. In some other embodiments, phase-shift layer 120 can be etched or otherwise trimmed, for example, using any suitable wet chemical etch process. Other suitable etching techniques and/or chemistries will depend on a given application and will be apparent in light of this disclosure.

As will be appreciated further in light of this disclosure, in some cases it may be desirable to produce one or more phase-shift features on substrate 110 which are of different dimensions from others of such phase-shift features. For instance, consider the phase-shift feature of FIG. 2C that is encircled by the dashed ellipse therein. As can be seen, that example phase-shift feature is only partially covered by photoresist pattern 140. As a result, it has undergone only partial trim etching, in accordance with an embodiment, and thus is of a different width as compared to the fully covered example phase-shift features depicted on the left side of the photomask plate 101 and the uncovered example phase-shift features depicted on the right side thereof. Extending photoresist pattern 140 to fully cover the encircled phase-shift feature would produce another phase-shift feature like those examples depicted on the left, while reducing the dimensions of photoresist pattern 140 to avoid coverage of the encircled feature would produce another phase-shift feature like those examples depicted on the right. Other suitable uses for the disclosed trim etching techniques will depend on a given application and will be apparent in light of this disclosure.

Whichever trim etching technique is implemented, it may be desirable in some cases to ensure that the etchant utilized has a high etch selectivity in favor of phase-shift layer 120 as compared to substrate 110. For instance, in one specific example embodiment, trim etching can be performed with an etchant having high etch selectivity for a molybdenum silicide compound (e.g., $MoSi_2$, $MoSi_xN_y$, $MoSi_xN_yO_z$, etc.) phase-shift layer 120 as compared to a quartz substrate 110 (e.g., etch selectivity of greater than or equal to 5:1 molybdenum silicide compound-to-quartz). Other suitable etch selectivity considerations will depend on a given application and will be apparent in light of this disclosure.

Figure 2D:
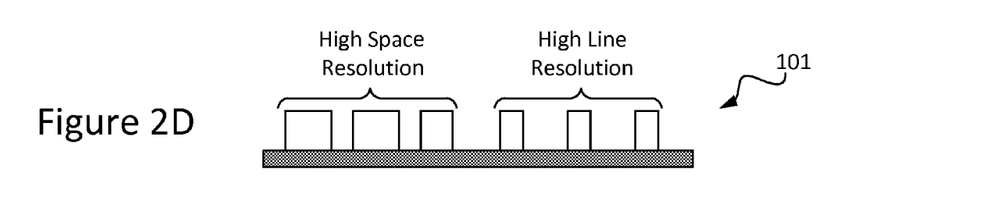
FIG. 2D is a cross-section view of the photomask plate of FIG. 2C after stripping away photoresist pattern and absorber layer, in accordance with an embodiment of the present invention.

Subsequently, the process flow continues as in FIG. 2D, which is a cross-section view of the photomask plate 101 of FIG. 2C after stripping away photoresist pattern 140 and absorber layer 130, in accordance with an embodiment of the present invention. Any plasma ashing process which utilizes oxygen ($O_2$), for example, as the reactive species can be used to strip away photoresist pattern 140. Also, and in accordance with an embodiment, any Cr etch plasma containing gases such as chlorine ($Cl_2$), $O_2$, etc., can be used to strip away a Cr absorber layer 130. Other suitable stripping techniques and/or chemistries will depend on a given application and will be apparent in light of this disclosure.

As can be seen, upon completion of the process flow depicted in FIGS. 2A-2D, a photomask plate 101 is formed having both: (1) a high space resolution region/portion (e.g., molybdenum silicide compound features having very small spaces there between); and (2) a high line resolution region/portion (e.g., very small molybdenum silicide compound line features). As will be appreciated in light of this disclosure, line resolution (e.g., minimum line feature size) is determined, at least in part, by the process time of etching phase-shift layer 120, discussed above with reference to FIG. 2C. Thus, and in accordance with an embodiment, there is virtually no limit to the size of features which may be produced, as long as the pattern is not collapsed, for example, during the cleaning process.

Resolution Enhancement Process Flow #2

FIGS. 3A-3D illustrate a CD resolution enhancement process flow in accordance with another embodiment of the present invention. The process flow begins as in FIG. 3A, which is a cross-section view of a photomask plate 102 formed by low-bias process patterning of the photomask blank 100 of FIG. 1, in accordance with an embodiment of the present invention. Like described above with reference to FIG. 2A, the low-bias process patterning may provide a photomask plate 102 having high space resolution (i.e., small space size). However, unlike in FIG. 2A, here only the absorber layer 130 has been patterned to prepare for forming a pattern of phase-shift features from phase-shift layer 120 on substrate 110. The low-bias process patterning can be performed using any suitable dry etch and/or plasma etch techniques, in accordance with an embodiment. After patterning, photomask plate 102 may be cleaned, as desired.

Figure 3A:
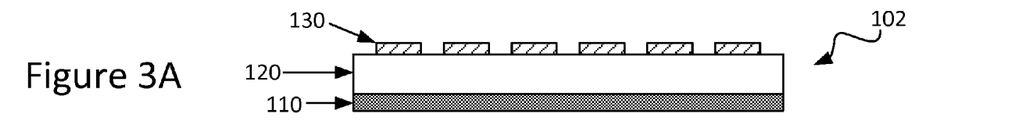
FIG. 3A is a cross-section view of a photomask plate formed by low-bias process patterning of the photomask blank of FIG. 1, in accordance with an embodiment of the present invention.
Figure 3B:
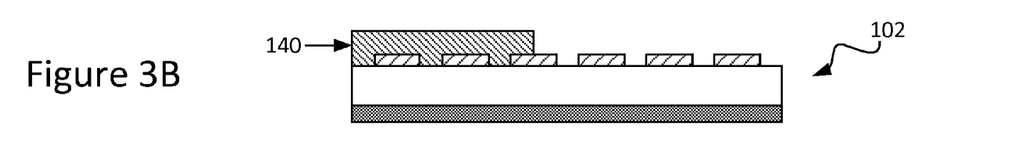
FIG. 3B is a cross-section view of the photomask plate of FIG. 3A after defining a photoresist pattern thereon, in accordance with an embodiment of the present invention.

Next, the process flow continues as in FIG. 3B, which is a cross-section view of the photomask plate 102 of FIG. 3A after defining a photoresist pattern 140 thereon, in accordance with an embodiment of the present invention. As similarly described above with reference to FIG. 2B, here this additional lithography process may be performed, for example, to define the region/portion of photomask plate 102 that is to be populated by phase-shift features characterized by high line resolution. As will be appreciated further, and in accordance with an embodiment, the discussion provided above with reference to FIG. 2B of suitable configurations, techniques, and materials for photoresist pattern 140 applies equally here.

Figures 3C, 3D:
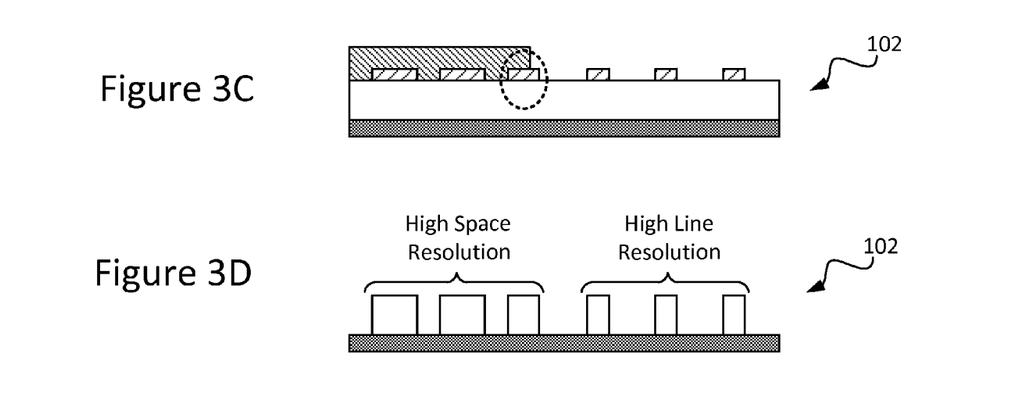
FIG. 3C is a cross-section view of the photomask plate of FIG. 3B after trim etching the absorber layer thereof, in accordance with an embodiment of the present invention.
FIG. 3D is a cross-section view of the photomask plate of FIG. 3C after stripping away photoresist pattern, etching phase-shift layer, and stripping away absorber layer, in accordance with an embodiment of the present invention.

Thereafter, the process flow continues as in FIG. 3C, which is a cross-section view of the photomask plate 102 of FIG. 3B after trim etching the absorber layer 130 thereof, in accordance with an embodiment of the present invention. Absorber layer 130 can be etched, for example, by plasma etching. In some specific example instances in which absorber layer 130 comprises Cr, trim etching can be performed with isotropic plasma with chlorine (Cl)-based chemistry. In some such cases, a high ICP source power (e.g., greater than or equal to about 50 W), high pressure (e.g., greater than or equal to about 2 mT), and low bias power (e.g., less than or equal to about 50 W) may be desired. Furthermore, in some instances, additional gases such as chlorine ($Cl_2$) and/or oxygen ($O_2$) may be used in the etching process in conjunction with buffer gases such as argon (Ar), helium (He), nitrogen ($N_2$), and/or $CO_x$ compounds. In some other embodiments, absorber layer 130 can be etched, for example, using any suitable wet chemical etch process. Other suitable etching techniques and/or chemistries will depend on a given application and will be apparent in light of this disclosure.

As will be appreciated in light of this disclosure, and as similarly discussed above with reference to FIG. 2C, in some cases it may be desirable to produce one or more phase-shift features on substrate 110 which are of different dimensions from others of such phase-shift features. As will be appreciated further, alterations to the dimensions (e.g., width) of a portion of the patterned absorber layer 130 can be made to produce similar changes in the dimensions of the underlying phase-shift feature that is to be formed from phase-shift layer 120. Thus, for instance, consider the portion of patterned absorber layer 130 of FIG. 3C that is encircled by the dashed ellipse therein. As can be seen, that example portion is only partially covered by photoresist pattern 140. As a result, it has undergone only partial trim etching, in accordance with an embodiment, and thus is of a different width as compared to the fully covered example portions of patterned absorber layer 130 depicted on the left side of the photomask plate 102 and the uncovered example portions of patterned absorber layer 130 depicted on the right side thereof. Extending photoresist pattern 140 to fully cover the encircled absorber portion would produce another patterned absorber portion like those examples depicted on the left, while reducing the dimensions of photoresist pattern 140 to avoid coverage of the encircled absorber portion would produce another patterned absorber portion like those examples depicted on the right. Other suitable uses for the disclosed techniques will depend on a given application and will be apparent in light of this disclosure.

Subsequently, the process flow continues as in FIG. 3D, which is a cross-section view of the photomask plate 102 of FIG. 3C after stripping away photoresist pattern 140, etching phase-shift layer 120, and stripping away absorber layer 130, in accordance with an embodiment of the present invention. As similarly discussed above with reference to FIG. 2D, and in accordance with an embodiment, any plasma ashing process which utilizes $O_2$, for example, as the reactive species can be used to strip away photoresist pattern 140. Also, and in accordance with an embodiment, any of the various molybdenum silicide compound etch processes/techniques discussed above with reference to FIG. 2C (e.g., plasma etching with $SF_6$, $NF_3$, $C_xF_yH_z$, Ar, He, $N_2$, $CO_x$, etc.; any wet chemical etch process) can be used to etch a molybdenum silicide compound (e.g., $MoSi_2$, $MoSi_xN_y$, $MoSi_xN_yO_z$, etc.) phase-shift layer 120. Furthermore, and in accordance with an embodiment, any Cr etch plasma containing gases such as $Cl_2$, $O_2$, etc., can be used to strip away a Cr absorber layer 130. Other suitable stripping and/or etching techniques and/or chemistries will depend on a given application and will be apparent in light of this disclosure.

As can be seen, upon completion of the process flow depicted in FIGS. 3A-3D, a photomask plate 102 is formed having both: (1) a high space resolution region/portion (e.g., molybdenum silicide compound features having very small spaces there between); and (2) a high line resolution region/portion (e.g., very small molybdenum silicide compound line features). As will be appreciated in light of this disclosure, line resolution (e.g., minimum line feature size) is determined, at least in part, by the process time of etching absorber layer 130 (e.g., Cr), discussed above with reference to FIG. 3C. Thus, and in accordance with an embodiment, there is virtually no limit to the size of features which may be produced, as long as the pattern is not collapsed, for example, during the cleaning process.

As will further be appreciated, the process flow of FIGS. 3A-3D avoids phase control concerns/complications because CD trimming is performed at the absorber layer 130 (e.g., Cr) level. Therefore, no additional high-selectivity etch process (e.g., for molybdenum silicide compounds such as $MoSi_2$, $MoSi_xN_y$, $MoSi_xN_yO_z$, etc.), such as that discussed above with reference to FIG. 2C, is required to minimize or otherwise reduce substrate (e.g., quartz) loss which otherwise would affect phase error.

Resolution Enhancement Process Flow #3

FIGS. 4A-4F illustrate a CD resolution enhancement process flow in accordance with another embodiment of the present invention. The process flow begins as in FIG. 4A, which is a cross-section view of a photomask plate 103 formed by high-bias process patterning of the photomask blank 100 of FIG. 1, in accordance with an embodiment of the present invention. As can be seen, the high-bias process patterning may provide a photomask plate 103 having high line resolution (i.e., small line size). During such patterning, the absorber layer 130 may be patterned to prepare for forming a pattern of phase-shift features from phase-shift layer 120 on substrate 110. The small line features of absorber layer 130 can be formed by any of a wide variety of techniques, including, but not limited to: (1) high dose condition in beam; (2) long develop time; and/or (3) long etch time. After patterning, photomask plate 103 may be cleaned, as desired.

Figure 4A:
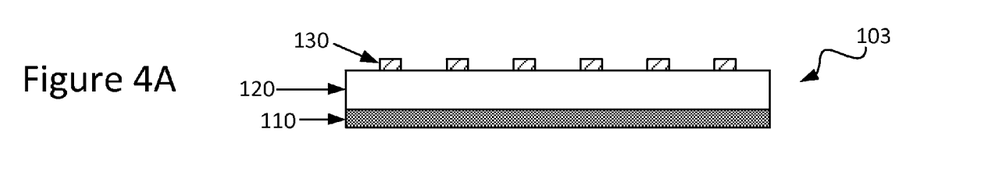
FIG. 4A is a cross-section view of a photomask plate formed by high-bias process patterning of the photomask blank of FIG. 1, in accordance with an embodiment of the present invention.
Figure 4B:
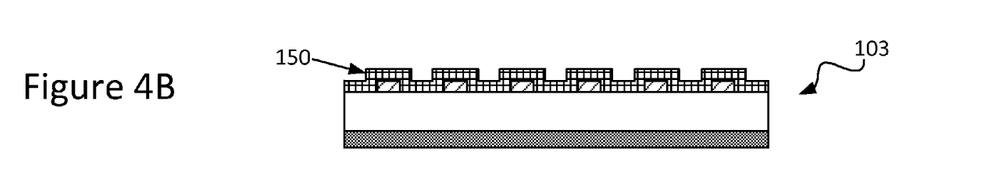
FIG. 4B is a cross-section view of the photomask plate of FIG. 4A after depositing a spacer thereon, in accordance with an embodiment of the present invention.

Next, the process flow continues as in FIG. 4B, which is a cross-section view of the photomask plate 103 of FIG. 4A after depositing a spacer 150 thereon, in accordance with an embodiment of the present invention. As can be seen, spacer 150 can be disposed on at least a portion of the surface or other exposed topology resulting from patterning absorber layer 130 on phase-shift layer 120.

In accordance with an embodiment, it may be desirable to ensure that spacer 150 comprises a material that does not adversely interact with (e.g., negatively affect dimensional/material integrity such as by melting, chemical reaction, etc.) the absorber layer 130 (e.g., Cr), the phase-shift layer 120 (e.g., $MoSi_2$, $MoSi_xN_y$, $MoSi_xN_yO_z$, etc.), and a subsequently defined photoresist pattern 140 (discussed below with reference to FIG. 4C). Furthermore, spacer 150 may be chosen, at least in part, based on the compatibility of its etch chemistry (also discussed below with reference to FIG. 4C) with the remainder of the process flow of FIGS. 4A-4F. Thus, in accordance with an embodiment, spacer 150 may comprise, for example: (1) a metal, such as titanium (Ti) or tantalum (Ta); (2) a nitride, such as titanium nitride (TiN) or tantalum nitride (TaN); and/or (3) a carbon (C)-containing material, such as amorphous carbon. Other suitable materials for spacer 150 will depend on a given application and will be apparent in light of this disclosure.

Furthermore, in accordance with an embodiment, it may be desirable to ensure that spacer 150 is deposited or otherwise formed without causing excessive film stress and/or otherwise adversely affecting the flatness of photomask plate 103. Thus, and in accordance with an embodiment, spacer 150 may be deposited at a low temperature (e.g., less than or equal to about 250° C.). Examples of suitably low-temperature deposition techniques include, but are not limited to: (1) sputtering/physical vapor deposition (PVD); (2) chemical vapor deposition (CVD); and/or (3) atomic layer deposition (ALD). In one specific example instance, a spacer 150 comprising amorphous carbon may be deposited via sputtering/PVD. Other suitable deposition temperatures and/or techniques will depend on a given application and will be apparent in light of this disclosure.

As will be appreciated in light of this disclosure, and in accordance with an embodiment, the dimensions (e.g., thickness) of spacer 150 may be governed, at least in part, by the desired CD of the features to be formed from phase-shift layer 120 on substrate 110 (e.g., as desired for a given process node). Spacer 150 may be deposited as a layer ranging from the thickness of a single constituent atom (i.e., a monolayer) to as thick a layer as desired for a given application. As will be appreciated in light of this disclosure, and in accordance with an embodiment, adjustments may be made to the dimensions of spacer 150 to tailor the critical dimensions of a given feature to be etched from phase-shift layer 120. For example, by increasing or decreasing the thickness of spacer 150, space features of varying size may be formed from phase-shift layer 120 on substrate 110. In one specific example embodiment, spacer 150 may be of a sufficient thickness to provide sidewall coverage in the range of about 1-50 nm (e.g., about 10-20 nm). In some cases, spacer 150 may be substantially uniform over a given topology (e.g., formed by patterned absorber layer 130 and/or phase-shift layer 120) while in some other instances spacer 150 may be non-uniform, with desired thicknesses applied to particular surfaces/topological regions. Other suitable configurations for spacer 150 will depend on a given application and will be apparent in light of this disclosure.

Figure 4C:
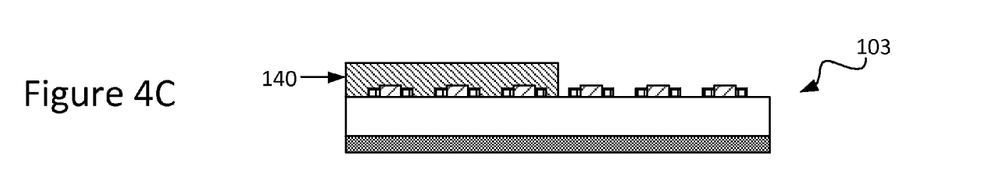
FIG. 4C is a cross-section view of the photomask plate of FIG. 4B after etching spacer and defining a photoresist pattern, in accordance with an embodiment of the present invention.

Next, the process flow continues as in FIG. 4C, which is a cross-section view of the photomask plate 103 of FIG. 4B after etching spacer 150 and defining a photoresist pattern 140, in accordance with an embodiment of the present invention. As can be seen, spacer 150 may be etched and then an additional lithography process may be performed to define the region/portion of photomask plate 103 that is to be populated by phase-shift features characterized by high space resolution.

In some instances in which spacer 150 comprises a metal (e.g., Ti, Ta, etc.), for example, etching thereof may be achieved with anisotropic plasma containing $Cl_2$. In some instances it may be desirable to preserve sidewall thickness; thus, and in accordance with one specific example embodiment, the anisotropic etching (e.g., physical sputter etch) may be performed with bias power greater than or equal to about 5 W and low pressure conditions (e.g., less than or equal to about 20 mT). Furthermore, in some instances, buffer gases such as Ar, He, $N_2$, and/or $O_2$ can be included in the etching process.

In some other instances in which spacer 150 comprises a carbon-containing material (e.g., amorphous carbon), for example, etching may be achieved with anisotropic plasma containing $O_2$. As previously noted, in some instances it may be desirable to preserve sidewall thickness; thus, and in accordance with one specific example embodiment, the anisotropic etching (e.g., physical sputter etch) may be performed with bias power greater than or equal to about 3 W and low pressure conditions (e.g., less than or equal to about 50 mT). Furthermore, in some instances, buffer gases such as Ar, He, $N_2$, and/or $O_2$ can be included in the etching process, for example, to control etch selectivity with respect to photoresist pattern 140 (e.g., etch selectivity of greater than or equal to about 2:1 carbon-based spacer-to-photoresist), as discussed below with reference to FIG. 4D.

After etching spacer 150, a photoresist pattern 140 can be defined or otherwise formed over at least a portion of the resultant topology. Again, as similarly described above with reference to FIG. 2B, here this additional lithography process may be performed, for example, to define the region/portion of photomask plate 103 that is to be populated by phase-shift features characterized by high space resolution. As will be appreciated further, and in accordance with an embodiment, the discussion of suitable configurations, techniques, and materials for photoresist pattern 140 provided above with reference to FIG. 2B applies equally here.

Figure 4D:
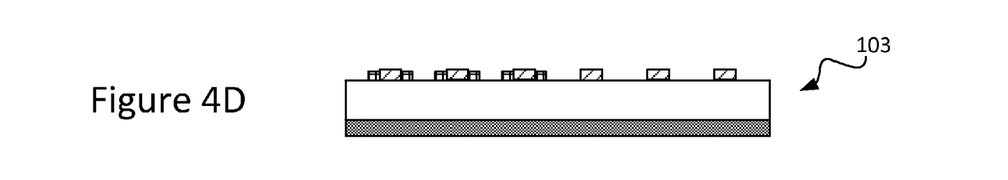
FIG. 4D is a cross-section view of the photomask plate of FIG. 4C after partially removing spacer and stripping away photoresist pattern, in accordance with an embodiment of the present invention.

Thereafter, the process flow continues as in FIG. 4D, which is a cross-section view of the photomask plate 103 of FIG. 4C after partially removing spacer 150 and stripping away photoresist pattern 140, in accordance with an embodiment of the present invention. As can be seen, spacer 150 can be partially removed to define the region/portion of photomask plate 103 that is to be populated by phase-shift features characterized by high line resolution. In accordance with an embodiment, the desired portions of spacer 150 can be removed using any of the spacer etching techniques discussed above with reference to FIG. 4C, but in some instances it may be desirable, for example, to lower the bias power (e.g., to less than or equal to about 5 W) to maintain isotropic conditions.

After partially removing spacer 150, photoresist pattern 140 can be stripped away to reveal the region of photomask plate 103 that is to be populated by phase-shift features characterized by high space resolution. As similarly discussed above with reference to FIG. 3D, and in accordance with an embodiment, photoresist pattern 140 can be removed using any plasma ashing process which utilizes $O_2$ as the reactive species. Other suitable removal/stripping techniques and/or chemistries will depend on a given application and will be apparent in light of this disclosure.

Figure 4E:
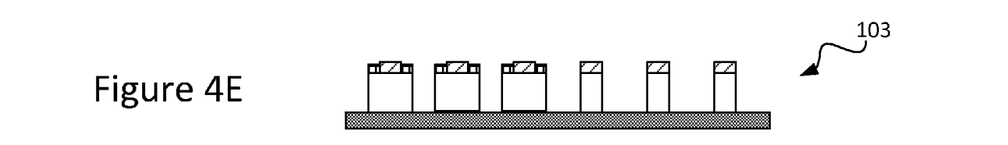
FIG. 4E is a cross-section view of the photomask plate of FIG. 4D after etching the phase-shift layer thereof, in accordance with an embodiment of the present invention.

Next, the process flow continues as in FIG. 4E, which is a cross-section view of the photomask plate 103 of FIG. 4D after etching the phase-shift layer 120 thereof, in accordance with an embodiment of the present invention. As will be appreciated, the discussion of suitable etching techniques for phase-shift layer 120 provided above with reference to FIG. 2C applies equally here, in accordance with an embodiment. As can be seen, phase-shift layer 120 can be etched to produce one or more phase-shift features on substrate 110. As can be seen further, and in accordance with an embodiment, the remaining portion of spacer 150 can provide sufficient sidewall coverage of at least a portion of the patterned absorber layer 130 (e.g., Cr) so as to assist with adjusting the dimensions (e.g., width) of one or more underlying phase-shift features that are to be formed from phase-shift layer 120.

Figure 4F:
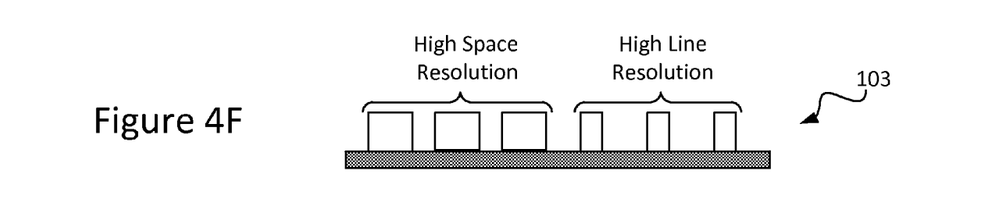
FIG. 4F is a cross-section view of the photomask plate of FIG. 4E after removing the remainder of spacer and stripping away absorber layer, in accordance with an embodiment of the present invention.

The process flow continues as in FIG. 4F, which is a cross-section view of the photomask plate 103 of FIG. 4E after removing the remainder of spacer 150 and stripping away absorber layer 130, in accordance with an embodiment of the present invention. As will be appreciated, the discussion of suitable removal techniques for spacer 150 provided above with reference to FIG. 4D applies equally here, in accordance with an embodiment. As will further be appreciated, the discussion of suitable stripping techniques for absorber layer 130 (e.g., Cr) provided above with reference to FIG. 2D applies equally here, in accordance with an embodiment.

As can be seen, upon completion of the process flow depicted in FIGS. 4A-4F, a photomask plate 103 is formed having both: (1) a high space resolution region/portion (e.g., molybdenum silicide compound features having very small spaces there between); and (2) a high line resolution region/portion (e.g., very small molybdenum silicide compound line features). As will be appreciated in light of this disclosure, space resolution (e.g., minimum space feature size) is determined, at least in part, by the deposition thickness of spacer 150; that is, adjusting the sidewall coverage of absorber layer 130 with spacer 150 can be done to alter the CD of the resultant phase-shift features to be formed. As will further be appreciated, the process flow of FIGS. 4A-4F avoids phase control concerns/complications because only one etch step is involved to define phase-shift layer 120.

It should be noted that the layouts of photomask plates 101, 102, and 103 are not necessarily drawn to scale or intended to limit the claimed invention in any way. For instance, while the cross-section views shown in FIGS. 1, 2A-2D, 3A-3D, and 4A-4F generally indicate linear surfaces, uniform thicknesses, and feature symmetry, an actual implementation of the techniques disclosed herein may have non-linear and/or non-uniform characteristics or otherwise be variable, given real-world limitations of the processing equipment and techniques used. In short, FIGS. 1, 2A-2D, 3A-3D, and 4A-4F are provided merely to show a few possible example photomask plate layout schemes configured in accordance with one or more embodiments of the present invention.

Example System

Figure 5:
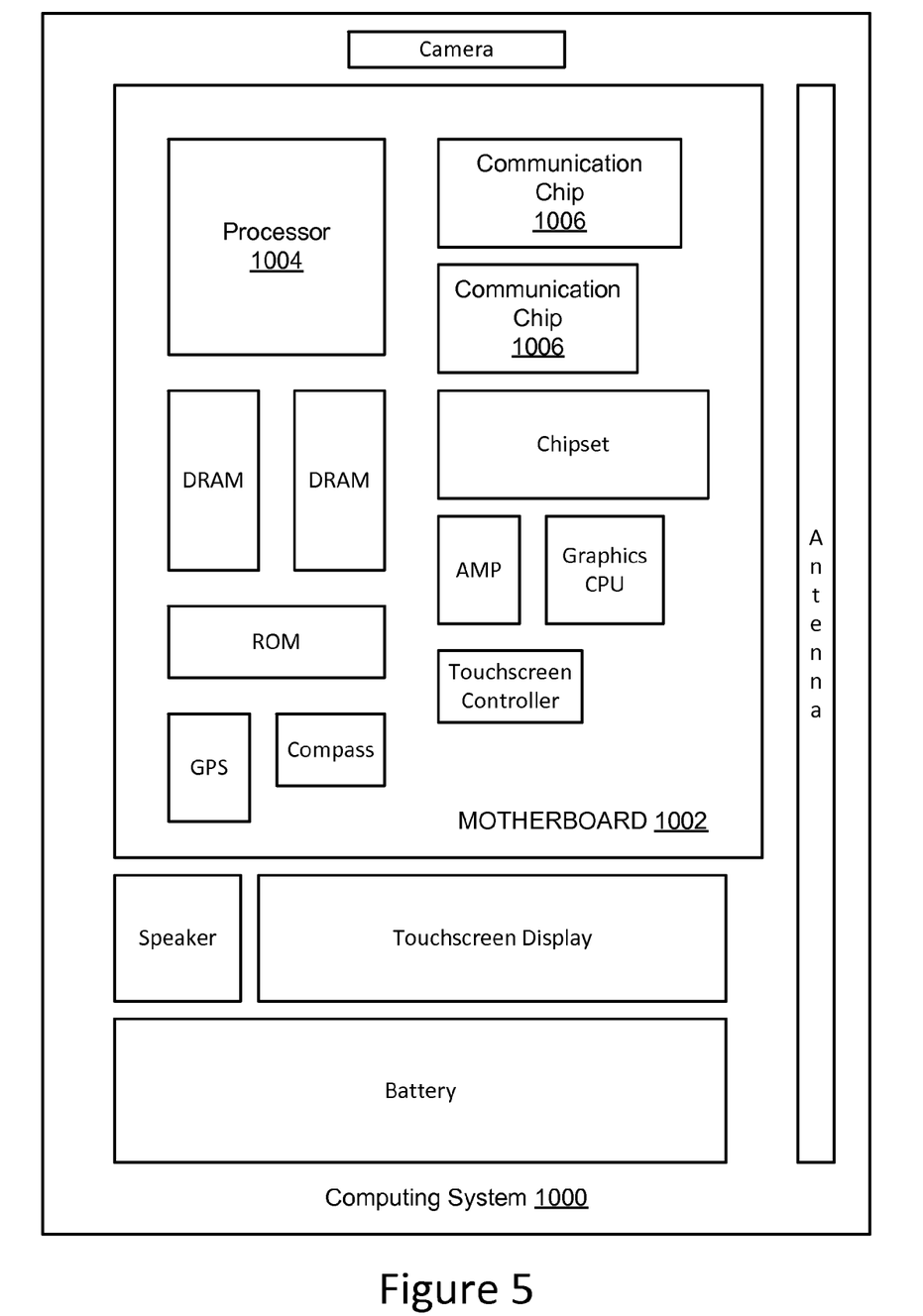
FIG. 5 illustrates a computing system implemented with integrated circuit (IC) structures or devices formed by one or more of the critical dimension resolution enhancing techniques disclosed herein, in accordance with an example embodiment of the present invention.

FIG. 5 illustrates a computing system 1000 implemented with integrated circuit (IC) structures or devices formed by one or more of the critical dimension resolution enhancing techniques disclosed herein, in accordance with an example embodiment of the present invention. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed by using one or more of the critical dimension resolution enhancing techniques disclosed herein, in accordance with an example embodiment of the present invention. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard memory circuitry that is implemented with one or more integrated circuit structures or devices formed by using one or more of the critical dimension resolution enhancing techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed by using one or more of the critical dimension resolution enhancing techniques as described herein, where the integrated circuit is formed using a phase-shift lithography mask configured in accordance with an embodiment of the present invention. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed by implementing one or more of the critical dimension resolution enhancing techniques, as variously described herein.

Numerous embodiments will be apparent in light of this disclosure. One example embodiment of the present invention provides a photomask including a substrate and a plurality of phase-shift features formed on the substrate, wherein a first sub-set of the phase-shift features is characterized by a minimum space feature size, and wherein a second sub-set of the phase-shift features is characterized by a minimum line feature size, wherein the photomask has a combined pattern resolution of less than 105 nm, the combined pattern resolution being equal to the sum of the minimum space feature size and the minimum line feature size. In some cases, the substrate comprises quartz. In some example cases, the substrate has been etched to form the plurality of phase-shift features. In some other example cases, the plurality of phase-shift features is formed from a layer of molybdenum disilicide ($MoSi_2$), molybdenum silicide nitride ($MoSi_xN_y$), and/or molybdenum silicide nitride oxide ($MoSi_xN_yO_z$) that has been deposited on the substrate. In some instances, at least one of the phase-shift features of the first sub-set is of different dimensions as compared with the other phase-shift features of the plurality. In one specific example case, the combined pattern resolution is less than or equal to 100 nm. In another specific example case, the combined pattern resolution is less than or equal to 90 nm. In some cases, a lithography system comprising the photomask is provided.

Another example embodiment of the present invention provides a method of fabricating a photomask, the method including providing a substrate and forming a plurality of phase-shift features on the substrate, a first sub-set of the phase-shift features being characterized by a minimum space feature size and a second sub-set of the phase-shift features being characterized by a minimum line feature size, wherein the photomask has a combined pattern resolution of less than 105 nm, the combined pattern resolution being equal to the sum of the minimum space feature size and the minimum line feature size. In some cases, forming the plurality of phase-shift features includes providing a layer of phase-shifting material on the substrate, patterning a high space resolution pattern of absorber material on the layer of phase-shifting material, etching the resultant structure to form an initial plurality of phase-shift features having the patterned absorber material disposed thereon, the initial plurality including at least an initial first sub-set of phase-shift features and an initial second sub-set of phase-shift features, defining a photoresist pattern on the initial first sub-set of phase-shift features, etching the resultant structure to modify the initial second sub-set of phase-shift features, thereby forming the second sub-set of phase-shift features, removing the photoresist pattern from the initial first sub-set of phase-shift features, thereby revealing the first sub-set of phase-shift features, and stripping away the patterned absorber material. In some such cases, the substrate comprises quartz, the phase-shifting material comprises molybdenum disilicide ($MoSi_2$), molybdenum silicide nitride ($MoSi_xN_y$), and/or molybdenum silicide nitride oxide ($MoSi_xN_yO_z$), and the absorber material comprises chromium (Cr), tantalum nitride (TaN), or tantalum oxynitride (TaON). In some example instances, etching the resultant structure to modify the initial second sub-set of phase-shift features comprises using isotropic plasma with fluorine (F)-based chemistry. In some other example instances, removing the photoresist pattern comprises using a plasma ashing process which utilizes oxygen ($O_2$). In some cases, forming the plurality of phase-shift features includes providing a layer of phase-shifting material on the substrate, patterning a high space resolution pattern of absorber material on the layer of phase-shifting material, the patterned absorber material including at least a first sub-set of patterned absorber features and a second sub-set of patterned absorber features, defining a photoresist pattern on the first sub-set of patterned absorber features, etching the resultant structure to modify the second sub-set of patterned absorber features, removing the photoresist pattern, etching the resultant structure to form the plurality of phase-shift features, the plurality including at least the first sub-set of phase-shift features having the first sub-set of patterned absorber features disposed thereon and the second sub-set of phase-shift features having the second sub-set of patterned absorber features disposed thereon, and stripping away the patterned absorber material. In some such cases, etching the resultant structure to modify the second sub-set of patterned absorber features comprises using isotropic plasma with chlorine (Cl)-based chemistry, removing the photoresist pattern comprises using a plasma ashing process which utilizes oxygen ($O_2$), and/or etching the resultant structure to form the plurality of phase-shift features comprises using isotropic plasma with fluorine (F)-based chemistry. In some cases, forming the plurality of phase-shift features includes providing a layer of phase-shifting material on the substrate, patterning a high line resolution pattern of absorber material on the layer of phase-shifting material, depositing a spacer material on a topology formed by the patterned absorber material and the phase-shifting material, partially etching the spacer material to expose the underlying patterned absorber material while retaining sidewall coverage thereof, wherein the partial etching results in at least a first sub-set of spacer/absorber features and a second sub-set of spacer/absorber features, defining a photoresist pattern on the first sub-set of spacer/absorber features, removing the spacer material from the second sub-set of spacer/absorber features, removing the photoresist pattern, etching the resultant structure to form the plurality of phase-shift features, the plurality including at least the first sub-set of phase-shift features having the first sub-set of spacer/absorber features disposed thereon and the second sub-set of phase-shift features having the absorber material of the second sub-set of spacer/absorber features disposed thereon, stripping away the spacer material disposed on the first sub-set of phase-shift features, and stripping away the patterned absorber material disposed on the first and second sub-sets of phase-shift features. In some such cases, the spacer material comprises at least one of titanium (Ti), tantalum (Ta), titanium nitride (TiN), tantalum nitride (TaN), and/or amorphous carbon and is deposited with a thickness in the range of about 1-50 nm. In some instances, partially etching the spacer material to expose the underlying patterned absorber material while retaining sidewall coverage thereof comprises using anisotropic plasma. In some instances, etching the resultant structure to form the plurality of phase-shift features comprises using isotropic plasma with fluorine (F)-based chemistry. In some instances, stripping away the spacer material disposed on the first sub-set of phase-shift features comprises using anisotropic plasma with chlorine ($Cl_2$)-based chemistry or oxygen ($O_2$)-based chemistry. In some cases, at least one of the phase-shift features of the first sub-set is of different dimensions as compared with the other phase-shift features of the plurality. In some cases, a photomask is provided by the methodology as variously defined in this paragraph.

Another example embodiment of the present invention provides a photomask including a substrate and a plurality of phase-shift features formed on the substrate, wherein a first sub-set of the phase-shift features is characterized by a minimum space feature size, and wherein a second sub-set of the phase-shift features is characterized by a minimum line feature size, wherein the photomask has a combined pattern resolution of 80 nm or less, the combined pattern resolution being equal to the sum of the minimum space feature size and the minimum line feature size.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A photomask comprising:
a substrate; and
a plurality of phase-shift features formed on the substrate, wherein a first sub-set of the phase-shift features is characterized by a minimum space feature size, and wherein a second sub-set of the phase-shift features is characterized by a minimum line feature size;
wherein the photomask has a combined pattern resolution of less than 105 nm, the combined pattern resolution being equal to the sum of the minimum space feature size and the minimum line feature size.

2. The photomask of claim 1, wherein the substrate comprises quartz.

3. The photomask of claim 1, wherein the substrate has been etched to form the plurality of phase-shift features.

4. The photomask of claim 1, wherein the plurality of phase-shift features is formed from a layer of molybdenum disilicide ($MoSi_2$), molybdenum silicide nitride ($MoSi_xN_y$), and/or molybdenum silicide nitride oxide ($MoSi_xN_yO_z$) that has been deposited on the substrate.

5. The photomask of claim 1, wherein at least one of the phase-shift features of the first sub-set is of different dimensions as compared with the other phase-shift features of the plurality.

6. The photomask of claim 1, wherein the combined pattern resolution is less than or equal to 100 nm.

7. The photomask of claim 1, wherein the combined pattern resolution is less than or equal to 90 nm.

8. A lithography system comprising the photomask of claim 1.

9. A method of fabricating a photomask, the method comprising:
providing a substrate; and
forming a plurality of phase-shift features on the substrate, a first sub-set of the phase-shift features being characterized by a minimum space feature size and a second sub-set of the phase-shift features being characterized by a minimum line feature size;
wherein the photomask has a combined pattern resolution of less than 105 nm, the combined pattern resolution being equal to the sum of the minimum space feature size and the minimum line feature size.

10. The method of claim 9, wherein forming the plurality of phase-shift features comprises:
providing a layer of phase-shifting material on the substrate;
patterning a high space resolution pattern of absorber material on the layer of phase-shifting material;
etching the resultant structure to form an initial plurality of phase-shift features having the patterned absorber material disposed thereon, the initial plurality including at least an initial first sub-set of phase-shift features and an initial second sub-set of phase-shift features;
defining a photoresist pattern on the initial first sub-set of phase-shift features;
etching the resultant structure to modify the initial second sub-set of phase-shift features, thereby forming the second sub-set of phase-shift features;
removing the photoresist pattern from the initial first sub-set of phase-shift features, thereby revealing the first sub-set of phase-shift features; and
stripping away the patterned absorber material.

11. The method of claim 10, wherein:
the substrate comprises quartz;
the phase-shifting material comprises molybdenum disilicide ($MoSi_2$), molybdenum silicide nitride ($MoSi_xN_y$), and/or molybdenum silicide nitride oxide ($MoSi_xN_yO_z$); and
the absorber material comprises chromium (Cr), tantalum nitride (TaN), or tantalum oxynitride (TaON).

12. The method of claim 10, wherein etching the resultant structure to modify the initial second sub-set of phase-shift features comprises using isotropic plasma with fluorine (F)-based chemistry.

13. The method of claim 10, wherein removing the photoresist pattern comprises using a plasma ashing process which utilizes oxygen ($O_2$).

14. The method of claim 9, wherein forming the plurality of phase-shift features comprises:
providing a layer of phase-shifting material on the substrate;
patterning a high space resolution pattern of absorber material on the layer of phase-shifting material, the patterned absorber material including at least a first sub-set of patterned absorber features and a second sub-set of patterned absorber features;
defining a photoresist pattern on the first sub-set of patterned absorber features;
etching the resultant structure to modify the second sub-set of patterned absorber features;
removing the photoresist pattern;
etching the resultant structure to form the plurality of phase-shift features, the plurality including at least the first sub-set of phase-shift features having the first sub-set of patterned absorber features disposed thereon and the second sub-set of phase-shift features having the second sub-set of patterned absorber features disposed thereon; and
stripping away the patterned absorber material.

15. The method of claim 14, wherein:
etching the resultant structure to modify the second sub-set of patterned absorber features comprises using isotropic plasma with chlorine (Cl)-based chemistry;

removing the photoresist pattern comprises using a plasma ashing process which utilizes oxygen ($O_2$); and/or etching the resultant structure to form the plurality of phase-shift features comprises using isotropic plasma with fluorine (F)-based chemistry.

16. The method of claim 9, wherein forming the plurality of phase-shift features comprises:

providing a layer of phase-shifting material on the substrate;

patterning a high line resolution pattern of absorber material on the layer of phase-shifting material;

depositing a spacer material on a topology formed by the patterned absorber material and the phase-shifting material;

partially etching the spacer material to expose the underlying patterned absorber material while retaining sidewall coverage thereof, wherein the partial etching results in at least a first sub-set of spacer/absorber features and a second sub-set of spacer/absorber features;

defining a photoresist pattern on the first sub-set of spacer/absorber features;

removing the spacer material from the second sub-set of spacer/absorber features;

removing the photoresist pattern;

etching the resultant structure to form the plurality of phase-shift features, the plurality including at least the first sub-set of phase-shift features having the first sub-set of spacer/absorber features disposed thereon and the second sub-set of phase-shift features having the absorber material of the second sub-set of spacer/absorber features disposed thereon;

stripping away the spacer material disposed on the first sub-set of phase-shift features; and stripping away the patterned absorber material disposed on the first and second sub-sets of phase-shift features.

17. The method of claim 16, wherein the spacer material comprises at least one of titanium (Ti), tantalum (Ta), titanium nitride (TiN), tantalum nitride (TaN), and/or amorphous carbon and is deposited with a thickness in the range of about 1-50 nm.

18. The method of claim 16, wherein partially etching the spacer material to expose the underlying patterned absorber material while retaining sidewall coverage thereof comprises using anisotropic plasma.

19. The method of claim 16, wherein etching the resultant structure to form the plurality of phase-shift features comprises using isotropic plasma with fluorine (F)-based chemistry.

20. The method of claim 16, wherein stripping away the spacer material disposed on the first sub-set of phase-shift features comprises using anisotropic plasma with chlorine ($Cl_2$)-based chemistry or oxygen ($O_2$)-based chemistry.

21. The method of claim 9, wherein at least one of the phase-shift features of the first sub-set is of different dimensions as compared with the other phase-shift features of the plurality.

22. A photomask fabricated by the method of claim 9.

23. A photomask fabricated by the method of claim 10.

24. A photomask fabricated by the method of claim 14.

25. A photomask fabricated by the method of claim 16.

26. A photomask comprising:

a substrate; and a plurality of phase-shift features formed on the substrate, wherein a first sub-set of the phase-shift features is characterized by a minimum space feature size, and wherein a second sub-set of the phase-shift features is characterized by a minimum line feature size;

wherein the photomask has a combined pattern resolution of 80 nm or less, the combined pattern resolution being equal to the sum of the minimum space feature size and the minimum line feature size.

* * * * *